(12) United States Patent
Filiol et al.

(10) Patent No.: US 6,515,553 B1
(45) Date of Patent: Feb. 4, 2003

(54) DELTA-SIGMA BASED DUAL-PORT MODULATION SCHEME AND CALIBRATION TECHNIQUES FOR SIMILAR MODULATION SCHEMES

(75) Inventors: Norman M. Filiol, Ottawa (CA);
Thomas A. D. Riley, Osgoode (CA);
Mark Miles Cloutier, Aylmer (CA);
Christian Cojocaru, Ottawa (CA);
Florinel G. Balteanu, Ottawa (CA)

(73) Assignee: Conexant Systems Inc., Irvine, CA (US)

( * ) Notice: Subject to any disclaimer, the term of this patent is extended or adjusted under 35 U.S.C. 154(b) by 0 days.

(21) Appl. No.: 09/628,330

(22) Filed: Jul. 28, 2000

(30) Foreign Application Priority Data

Sep. 10, 1999 (CA) ............................................. 2281522

(51) Int. Cl.[7] ................................................. H03C 3/00
(52) U.S. Cl. .......................... 332/127; 332/128; 375/376
(58) Field of Search .......................... 375/376; 331/1 A, 331/17; 332/127, 128

(56) References Cited

U.S. PATENT DOCUMENTS

| | | |
|---|---|---|
| 4,242,649 A | 12/1980 | Washburn, Jr. |
| 4,308,508 A | 12/1981 | Sommer et al. |
| 4,313,209 A | 1/1982 | Drucker ....................... 455/112 |
| 4,543,542 A | 9/1985 | Owen |
| 4,743,867 A | 5/1988 | Smith |
| 5,777,521 A | 7/1998 | Gillig et al. .................. 331/16 |
| 5,834,987 A | * 11/1998 | Dent ............................ 332/127 |
| 5,942,949 A | 8/1999 | Wilson et al. ................ 331/17 |
| 5,983,077 A | * 11/1999 | Dent ............................ 332/128 |

OTHER PUBLICATIONS

"An Agile ISM Band Frequency Synthesizer with Built–In GMSK Data Modulation", Norman M. Filiol, Thomas A.D. Riley, *Member, IEEE*, Calvin Plett, *Member, IEEE*, and Miles A. Copeland, *Fellow IEEE*, IEEE Journal of Solid–State Circuits, vol. 33, No. 7, Jul. 1998.

"Design and Realization of a Digital Modulator for Fractional –n Frequency Synthesis", Terrence P. Kenny, Thomas A.D. Riley, Norman M. Filiol, and Miles A. Copeland, *Fellow, IEEE*, IEEE Transactions on Vehicular Technology, vol. 48, No. 2, Mar. 1999.

"Delta–Sigma Modulation in Fractional –N Frequency Synthesis", Tom A.D. Riley, *Member, IEEE*, Miles A. Copeland, *Fellow, IEEE*, and Tad A. Kwasniewski, *Member, IEEE*, IEEE Journal of Solid–State Circuits, vol. 28, No. 5, May 1993.

* cited by examiner

*Primary Examiner*—Arnold Kinkead (57) ABSTRACT

PLL frequency synthesizers and their calibration techniques are described. The PLL frequency synthesizers are used to generate digital modulation of a carrier signal. A digital frequency divider in the feedback path of the loop has its division ratio controlled by a digital Δ-Σ modulator. The modulation of the carrier is achieved by applying a modulation signal to the input of the Δ-Σ modulator and to the input of the voltage-controlled oscillator of the PLL. The high frequency path and low frequency path of the modulation signal must be adjusted with respect to one another in order to obtain a good modulation. As the low frequency path can be accurately set, the calibration is performed only on the high frequency path. Digital calibration techniques for the high frequency path are described.

60 Claims, 6 Drawing Sheets

DELTA-SIGMA BASED DUAL-PORT MODULATION SCHEME AND CALIBRATION TECHNIQUES FOR SIMILAR MODULATION SCHEMES

FIELD OF INVENTION

The invention resides generally in digital modulation schemes which employ a phase-locked loop. In particular it is directed to new delta-sigma based dual port modulation schemes and calibration techniques applicable to similar modulation schemes wherein gain adjustments must further be calibrated.

BACKGROUND OF INVENTION

In order to support both voice and data communications, data transmission rates in excess of 1 Mb/s are now being commonly employed in wireless communications systems. The modulation of the carrier signal for transmission of such high-rate data streams must be very accurate, in terms of specific modulation index and spectral properties, while having a high spectral purity. It is also desirable that circuits used to generate such waveforms have low power consumption.

Several approaches to digital modulation of the carrier signal are known in the prior art. One approach is to generate the in phase (I) and quadrature (Q) components of the modulation at baseband using a direct digital synthesizer (DDS) and upconverting this to radio frequencies (RF) using frequency translation, i.e., using conversion mixers and RF synthesizers. Disadvantages of this approach are phase and amplitude mismatch in the I and Q paths, high analog complexity, and poor spurious performance.

Another known approach is to directly modulate the voltage-controlled oscillator (VCO) in a phase-locked loop (PLL) while simultaneously opening the loop. Disadvantages of this approach are carrier centre frequency drift (due to lack of feedback which in a closed PLL causes the VCO output signal to be set and locked to this frequency) and inaccurate modulation index due to variations in the tuning gain of the VCO due to process variations, temperature drift, and non-linearity of the tuning curve.

A third known approach is a direct modulation of a PLL within the loop bandwidth, allowing the carrier frequency to be set precisely. The direct modulation can be achieved by modulating the reference signal generator (the reference clock) of the PLL using a DDS or some other form of phase or frequency modulator. This normally results in high power consumption, particularly when using a DDS based modulator, or in inaccurate setting of the modulation index.

Another method of modulating the loop is through fractional-N frequency division. While several possible techniques of achieving fractional frequency division in a PLL exist, delta-sigma techniques provide the spectral purity and resolution required for direct modulation.

See, for example, Norman M. Filiol et al., "An Agile ISM Band Frequency Synthesizer with Built-In GMSK Data Modulation" *IEEE Journal of Solid State Circuits*, Vol. 33, No. 7, July 1988, pp998–1008; Terrence P. Kenny et al., "Design and Realization of a Digital ΔΣ Modulator for Fractional-n Frequency Synthesis" *IEEE Transactions on Vehicular Technologies*, Vol. 48, No. 2, March 1999, pp510–521; Tom A. D. Riley et al., "Delta-Sigma Modulation in Fractional-N Frequency Synthesis", *IEEE Journal of Solid State Circuits*, Vol. 28, No. 5 May 1993, pp553–559.

For data rates in excess of 100 Kb/s, techniques of direct modulation of a PLL begin to fail, due to the high loop bandwidth required in order to allow the modulation to pass. In order to obtain a stable loop, the loop bandwidth must be a small fraction of the reference frequency (reference clock). For integer-N PLLs, this is difficult to achieve while maintaining a narrow channel spacing with respect to the reference frequency. In fractional-N PLLs, a wider loop bandwidth can be used while maintaining a narrow channel spacing. However, in order to achieve good spectral purity, it is necessary to filter out the high frequency quantization noise in the loop. This is normally achieved through the use of a narrow loop bandwidth relative to the reference frequency and higher order filtering.

U.S. Pat. No. 5,777,521 Jul. 7, 1998 Gillig et al describes a parallel accumulator fractional-N frequency synthesizer in which a Δ-Σ modulator is used to control the divider in a feedback path of the loop.

Still another approach is digital modulation of the carrier signal is a two-point (or dual port) modulation of a PLL, where one modulation path leads through the VCO and the second through the reference input to the loop. In this approach, the high frequency components of the modulation signal are added directly to the VCO input, whereas the low frequency components are added by modulating the reference signal. A PLL presents a low pass filter response to the signal applied to the reference input, while it presents a high pass filter response to the signal applied to the VCO input. In other words, the transfer function H(w) for the low frequency components of the modulation signal is relatively flat up to the natural or resonant frequency of the PLL. The transfer function for the high frequency components, on the other hand, is represented by 1-H(w) which is relatively flat for frequencies above the resonant frequency. Therefore, by modulating at two points, this scheme can achieve a desirable characteristic of a flat frequency modulation deviation response versus modulation frequency.

The two-point (dual port) modulation also can achieve the above-stated other goals better than other schemes. The main advantage of this approach, however, is that the modulation gain of both modulation paths (high and low frequency) must be known accurately in an absolute sense in order to control the modulation index (and to achieve a flat modulation response). While the low frequency path can often be set to have accurate modulation gain, the high frequency path through the VCO is problematic.

One method of performing this calibration is through the use of a potentiometer which can be adjusted during bench testing to achieve the correct gain. The main disadvantage of this approach is that is must be performed on a part-by-part basis. Also, the potentiometer gain setting will drift over time due to component aging etc.

A second approach is to measure the tuning constant of the VCO and then store this value in an on-chip memory and use this value as an on-chip gain setting. This method has the disadvantage that the gain, again, must be measured on a part-by-part basis. This method, however, does ensure that the gain setting remains accurate over time.

A third approach is to have an on chip analog-to-digital converter (A/D) which measures the VCO tuning voltage for different synthesizer output frequencies. The gain values obtained can then be used to set the gain of the modulation path. This method has the disadvantage that the A/D directly loads the output of the loop filter and for wide bandwidths it needs several bits accuracy in the A/D.

U.S. Pat. No. 4,242,649 Dec. 30, 1980 Washburn, Jr.; U.S. Pat. No. 4,308,508 Dec. 29, 1981 Sommer et al; U.S. Pat.

No. 4,313,209 Jan. 26, 1982 Drucker; U.S. Pat. No. 4,543,542 Sep. 24, 1985 Owen; and U.S. Pat. No. 4,743,867 May 10, 1988 Smith provide examples of various such two-point modulation schemes and different calibration techniques including those mentioned above.

U.S. Pat. No. 5,834,987 Nov. 10, 1998 Dent describes a PLL frequency synthesizer with three-point modulation. In this embodiment, a Δ-Σ modulator is connected to a fractional frequency divider and uses an analog integrator which integrates an error signal until the error signal reaches a threshold defined by a comparator. A flip-flop responds to the output of the comparator and adjusts the fractional frequency divider. Because the accumulated error signal controls the frequency divider, the adjustment tends to be by a large amount, resulting in jitter.

U.S. Pat. No. 5,942,949 Aug. 24, 1999 Wilson et al describes a self calibrating phase-lock loop with auto-trim operations for selecting an appropriate oscillator operating curve. The patent, however, does not describe the calibration of modulation or a modulation technique.

In accordance with one aspect, the present invention provides a new digital frequency modulation scheme which is substantially free of many disadvantages of similar prior art modulation schemes, as outlined above.

In accordance with another aspect, the invention provides a new digital frequency modulation scheme in which modulation gain is accurately calibrated to achieve a flat response to a wide modulation signal. In a further aspect, the invention allows on chip calibration for unknown VCO tuning gain.

SUMMARY OF INVENTION

It is an object of the present invention to provide a new modulated PLL loop having a dual port modulation.

It is another object of the present invention to provide an improved PLL-type frequency synthesizer having a dual port modulation.

Briefly, the PLL-type modulated frequency synthesizer of the present invention comprises a controlled oscillator whose divided down output frequency is phase locked to the reference frequency of a stable reference oscillator. In a locked loop, the output frequency of the controlled oscillator is a multiple of the reference frequency:

$$fout = N * fref$$

where N is known as the division ratio. The frequency division of the controlled oscillator output signal is carried out in the feedback path of the loop by a frequency divider, which can be seen as a single bit phase quantizer allowing 0 or 2π radians of phase to be subtracted on each cycle of the divider output. In order to achieve high resolution from a single-bit phase quantizer, a digital Δ-Σ modulator is used to control the divider. The input to the Δ-Σ modulator is a digital word which represents the desired output frequency for the synthesizer and the output from the modulator is a bitstream whose average density represents the desired output frequency value plus high pass filtered quantization error.

The output signal of the divider is compared in a phase/frequency detector (PFD) with a stable reference clock signal to produce an error signal related to the difference in a component of the two compared signals. The resulting error signal is processed by a loop filter and used to control the controlled oscillator. This processing also attenuates the high frequency quantization noise introduced into the loop by the Δ-Σ modulator.

The desired digital modulation signal is applied to the input of the Δ-Σ modulator. A fixed offset for channel selection is added to these data bits. A fixed offset can be added to the output of the Δ-Σ modulator as well. As the transfer function from the Δ-Σ modulator input to the controlled oscillator output is low pass in nature, only low frequency components of the modulating signal are transferred through this path to the controlled oscillator output, when the loop bandwidth is much narrower than the data bandwidth.

In the frequency synthesizer of the present invention, the modulation data bits are also used to modulate directly the controlled oscillator, by summing them with the feedback control signal coming from the loop filter. As the path from the input to the output of the controlled oscillator is high pass in nature, only those frequency components of the modulation signal which fall outside the loop bandwidth appear at the controlled oscillator output. If the scaling factor K of this path is chosen correctly, the overall transfer function (including both paths) from the modulation input to the synthesizer output is all pass in nature and all the frequency components of the modulating signal appear undistorted at the synthesizer output. If the control of spectral properties of modulation is required or desirable, a pulse shaping filter may be inserted in this path (controlled oscillator path) prior to summing with the control signal coming from the loop filter.

In the modulation scheme according to the invention, the Δ-Σ modulator combined with a digital frequency divider allows an almost perfect control of the low frequency components of the modulating signal. This means that only the gain of the controlled oscillator path needs to be set. The high accuracy of the low frequency path allows calibration to be performed in order to determine the controlled oscillator tuning gain. Finally, the use of delta-sigma modulator to control the frequency divider allows the use of higher reference frequencies and lower division ratios, resulting in a reduced phase noise.

DETAILED DESCRIPTION OF PREFERRED EMBODIMENTS

Figure 1:
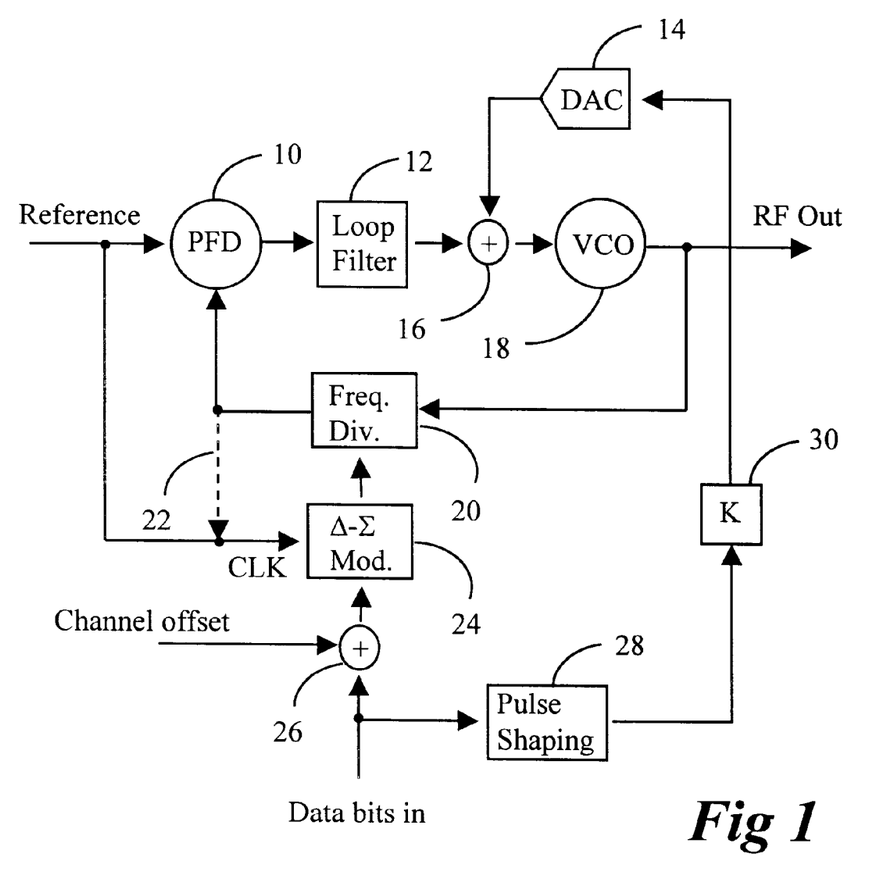
FIG. 1 is a block diagram of the frequency synthesizer according to one embodiment of the present invention.

FIG. 1 shows a block diagram of a PLL frequency synthesizer according to one preferred embodiment of the invention. In the Figure, a dual port PLL frequency synthesizer is shown to have a series of digital data bits as a modulation signal. In this embodiment, the PLL synthesizer includes a voltage controlled oscillator (VCO) 18 generating an output signal (RF Out), whose frequency is determined by a signal applied to the input of the VCO. Even though a voltage controlled oscillator is preferred, other types of controlled oscillators might also be used. The output signal of the VCO 18 is sampled by a frequency divider 20 placed in the feedback path of the PLL. The frequency of the VCO output signal is divided down by the frequency divider 20 and the divided signal is applied to one input of a phase/frequency detector (PFD) 10, where a component of the signal, for example its phase, is compared with the same component of a reference signal applied to another input of the PFD 10. As the stability of the centre frequency of the modulated output signal of the synthesizer depends on stability of the reference signal, this signal should be provided by a stable reference generator, for example a crystal oscillator. It should be noted that the phase/frequency detector could be designed to compare some other component of the signal such as frequency, phase or both frequency and phase.

The PFD 10 produces an error signal related to the difference in the component, e.g., the phase, of the compared signals. The error signal is processed by a loop filter 12, which may be, for example, a passive low pass filter, by attenuating high frequency components of the error signal. Some of these high frequency components are due to high frequency quantization noise introduced into the loop by Δ-Σ (delta-sigma) modulator 24. The error signal processed by the loop filter 12 is then applied as a control input signal to the VCO 18, to control the frequency of the VCO output signal (RF Out). In this manner the output signal is phase locked to the stable reference signal, meaning that the centre frequency of the modulated signal does not change when the reference frequency remains constant.

In the locked loop, the output frequency of the VCO 18 is a multiple of the reference frequency. This multiple is known as the division ratio N and the output frequency is given by: fout=N*fref, where fref is the reference frequency. The frequency divider 20 can be seen as a single bit phase quantizer which allows 0 or 2π radians of phase to be subtracted from the VCO output once per cycle of the divider output. In order to achieve high resolution from a single bit phase quantizer, a digital Δ-Σ modulator 24 is used to control the division ratio of the frequency divider 20. The modulation input to the Δ-Σ modulator 24 is a digital word which represents the desired output frequency for the synthesizer. The Δ-Σ modulator 24 takes in a clock signal from the reference signal to produce a new output once per cycle of the clock. According to another embodiment, the clock signal can be obtained from the output of the frequency divider 20 as shown by a dotted line 22. The output of the Δ-Σ modulator 24 is a bitstream whose average density represents the desired frequency value plus high pass filtered quantization error. Many suitable choices for Δ-Σ modulators have been disclosed in the prior art.

A desired digital modulation signal is applied to the input of the Δ-Σ modulator 24. A fixed channel offset may be added to the modulation signal at a summing node 26, prior to applying to the input of the modulator; to provide the possibility of channel selection. As discussed earlier, the transfer function from the input of the Δ-Σ modulator controlling the division ratio of the frequency divider of the PLL to the VCO output is low pass in nature. As a result, only low frequency components of the modulating signal are transferred through this path to the synthesizer output, assuming that the loop bandwidth is much narrower than the data bandwidth. In the dual port synthesizer, the modulation signal is also used to modulate directly the VCO 18. This is achieved by summing the modulation signal with the control input signal of the VCO, provided by the loop filter 12. The summation takes place at a summing node 16.

In the case of a voltage controlled oscillator, the digital modulation signal must be converted prior to summation to an analog signal by a digital-to-analog converter (DAC) 14. As part of the conversion process, the signal is scaled by a scaling factor K in a scaling circuit 30. As also discussed earlier, the path from scaling circuit 30 to DAC 14 to the VCO input and to the VCO output is high pass in nature, so that only those frequency components which fall outside of the loop bandwidth are transferred through this path (VCO path) to the synthesizer output.

As mentioned earlier, the gains of the high frequency path (VCO path) and the low frequency path must be accurately known. If both gains are correct, the overall transfer function, from the modulation input to the synthesizer output, will be all pass in nature, exhibiting a flat response so that all the frequency components of the modulation signal will appear undistorted at the synthesizer output. The gain of the low frequency path is easier to control and is generally calculated from the design, while the scaling circuit 30 adjusts the gain of the high frequency path (VCO path). In the afore-referenced patents, the scaling circuit can be realized by the use of potentiometer or other appropriate mechanisms.

If it is required or desirable to control the spectral properties of the modulation, a pulse shaping filter 28 may be inserted, for example prior to the summing node 16 in the VCO path. This filter can also be placed in the path of the modulation signal, before the summing node 26, though not required as this is a low frequency path.

It will be appreciated by those skilled in the art that the digital Δ-Σ modulator combined with a digital frequency divider allow an excellent control of the low frequency components of the modulation. This means that only the gain of the VCO path needs to be set in relation to the gain setting of the low frequency path. The high accuracy of the low frequency path allows calibration to be performed in order to determine the VCO tuning gain. Furthermore, the use of a Δ-Σ modulator to control the frequency divider allows the use of higher reference frequencies and lower division ratios, resulting in a reduced phase noise.

Figure 2:
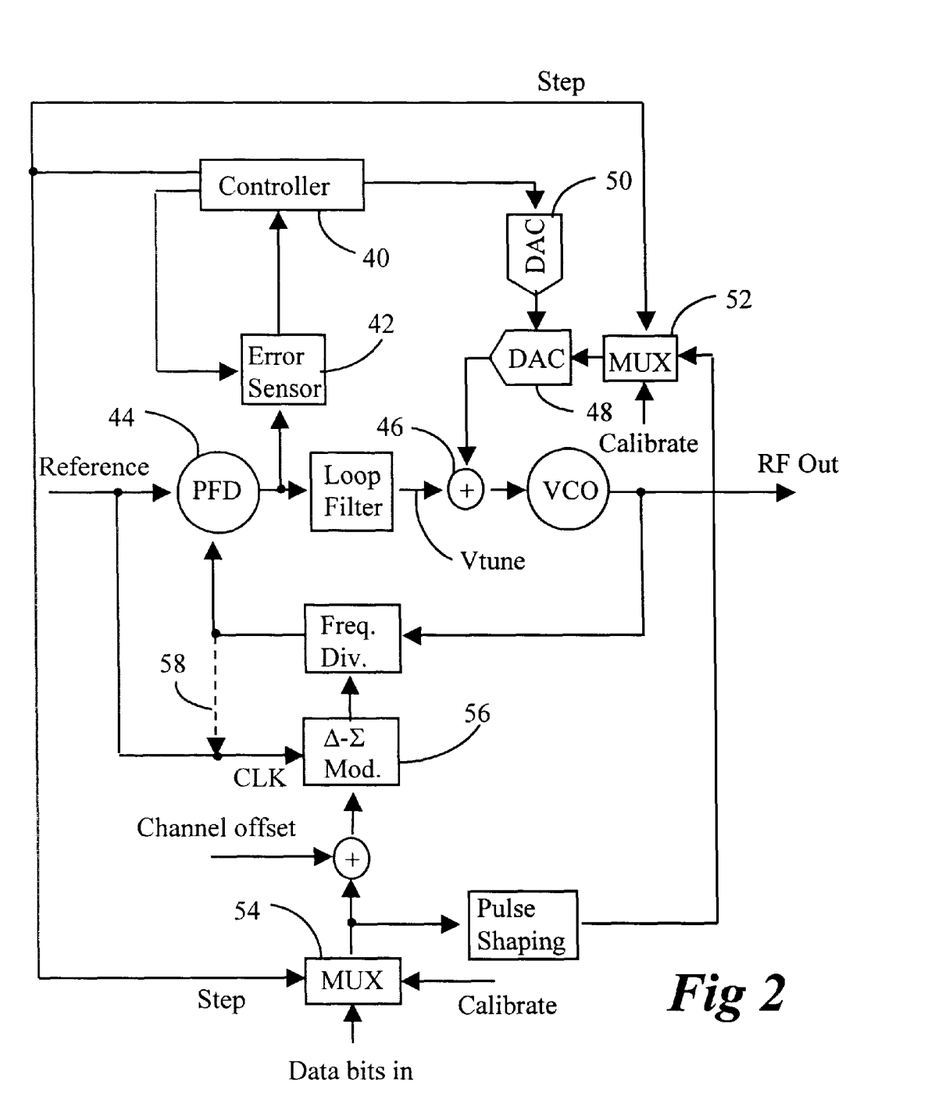
FIG. 2 is a block diagram of the frequency synthesizer equipped with a calibration mechanism according to another embodiment of the invention.

In order to achieve the desired modulation deviation (frequency modulation), the gain of the high frequency path to the VCO must be adjusted. Referring to FIG. 2, a calibration feature for this purpose is added to the dual port synthesizer of FIG. 1. This calibration feature consists of a digital controller 40 and an error sensor 42. Error sensor 42 measures error in the output of the PFD 44 and produces an error signal in relation to a reference value. Under control of the digital controller 40, the error signal is applied to the summing node 46 by way of modulation DAC 48 and calibration DAC 50. A step command is generated by the digital controller 40 and is applied to a loop switch made up of MUXes 52 and 54, which switch between the modulation and calibration operations under control of a calibrate signal.

The digital controller 40 also controls the operation of the error sensor. Like the embodiment shown in FIG. 1, the Δ-Σ modulator 56 can alternatively take its clock signal from the output of the frequency divider as shown by the dotted line 58 or from the reference frequency.

Because the low frequency path through the Δ-Σ modulator is perfectly calibrated in phase, it serves as a reference when calibrating the modulation. If the low frequency path is set to have a frequency deviation of 350 KHz and a step is applied to both the low frequency path and the high frequency path, the following will occur. If the gain of the high frequency path is set correctly, the modulation (and all of its frequency components) will appear at the RF output and no phase error step will be present on the tuning voltage to the VCO. This is shown as Vtune in FIG. 2. If the gain is set too high or too low, an error signal will appear on Vtune. The polarity of this error will depend on whether the gain is set too high or too low. Calibration is performed as follows. Calibration DAC 50 sets the full-scale range of modulation DAC 48, hence, controlling the gain. The bits in the calibration DAC are set as follows:

(1) The synthesizer is set to the center channel for the band of interest.
(2) The MSB (most significant bit) of calibration DAC 50 is set high.
(3) A step is applied to the high frequency and low frequency modulation paths, through MUX 52 and MUX 54.
(4) The error on Vtune is measured and a binary decision (0 or 1) is made based on the polarity of the error.
(5) If the error is "1", the MSB of the calibration DAC is set high. If the error is "0" the bit is set low.
(6) Steps (2)–(5) are repeated for each bit, until each bit in the calibration DAC is set from MSB to LSB (least significant bit).

Figure 3:
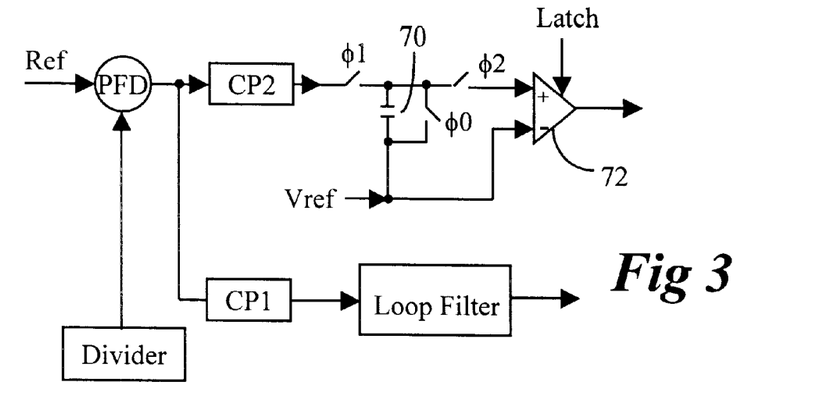
FIG. 3 is a block diagram of an error sensor according to one embodiment which can be used in the arrangement shown in FIG. 2.

One embodiment of the error sensor is shown in FIG. 3. In its simplest form, this device is an integrating and dump filter and consists of a second charge pump, CP2, an integrating capacitor 70, and a comparator 72. A source of a reference voltage Vref and a collection of switches φ0, φ1 and φ2 for proper operations including the sampling operation are also provided. A first charge pump CP1 is in the loop circuit and its output is sent to the loop filter.

Referring to FIG. 3, initially, before calibration, capacitor 70 is cleared of all charges by switch φ0. When the step is applied to the loop switch, switch φ1 is closed and the error signal is integrated onto capacitor 70 because switch φ2 is open. At the end of the integration period, switch φ1 is opened and switch φ2 is closed. The output of the comparator is then latched and is used to set the presently selected bit of calibration DAC 50 high or low based on the polarity of the error signal. Because CP2 is not in the feedback loop like CP1, any mismatch between CP1 and CP2 will appear as an error on integrating capacitor 70. This offset will be integrated causing the result of the integration to be off.

Figure 4:
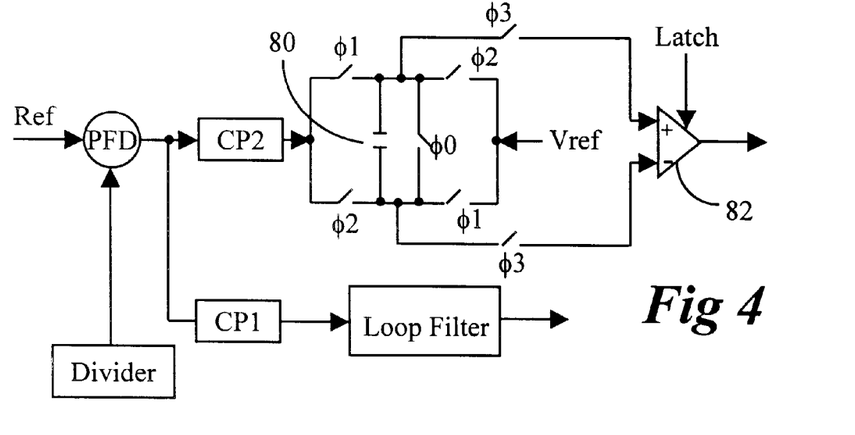
FIG. 4 is a block diagram of an error sensor according to another embodiment which can be used in the arrangement shown in FIG. 2.
Figure 5:
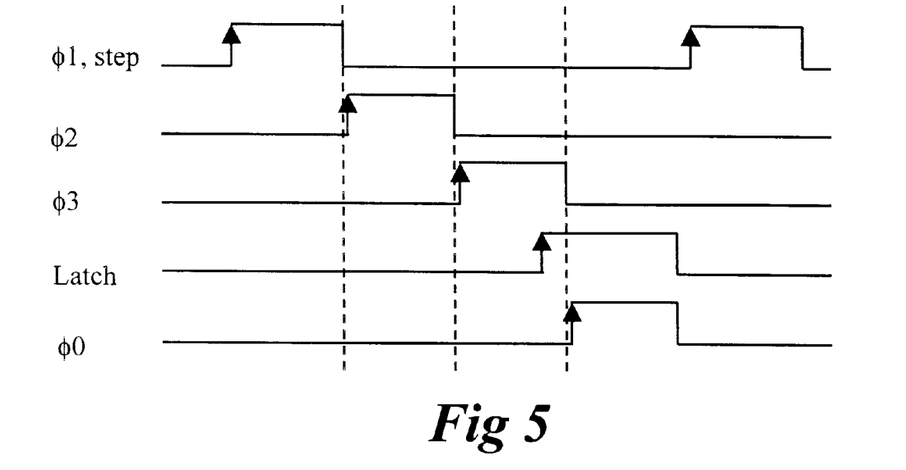
FIG. 5 shows timing waveforms illustrating the operation of the arrangement of FIG. 4.

The circuit shown in FIG. 4 mitigates this effect. This is done by taking advantage of both the rising and falling edges of the stimulating waveform (step). A timing diagram which shows the operations of the switches is shown in FIG. 5. For the reason of clarity, φ0–φ3 are used to indicate waveforms applied to respective switches. The first waveform, step φ1, is a main clock and a stimulus which is applied to both the Δ-Σ modulator 56 and the VCO modulation DAC 48 shown in FIG. 2. φ2 is used to flip the polarity of the integrating capacitor 80 of FIG. 4. On φ3, the charge on the capacitor 80 is transferred to the comparator 82 where a decision is made and latched when the "latch" signal goes high. φ0 is used to clear charge from the capacitor 80. These steps are repeated successively until all bits are set. During the rising edge of the φ1, an error step is generated and on the falling edge, an error of the opposite polarity is generated. By changing the polarity of the capacitor 80 using φ2, and integrating over this entire time period, any offsets caused by charge pump mismatch cancel and the signal swing is doubled, since both the rising and falling edges are used.

Figure 6:
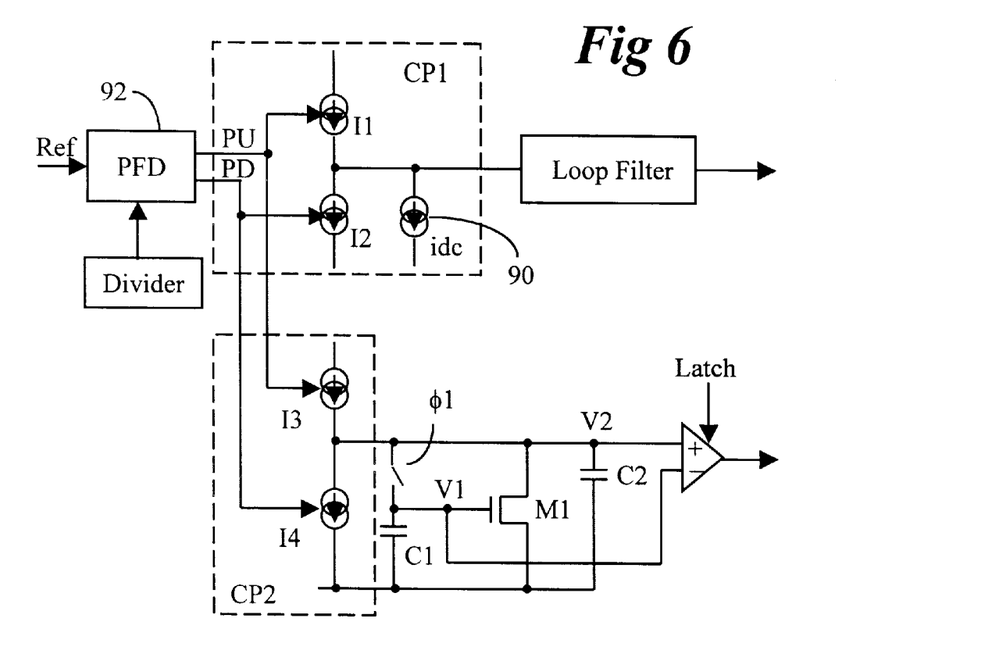
FIG. 6 is a block diagram of an error sensor according to another embodiment which can be used in the arrangement shown in FIG. 2.

Another embodiment of the error sensor, shown in FIG. 2, can be implemented using the arrangement shown in FIG. 6. FIG. 6 illustrates part of a synthesizer which has a dc phase offset provided by a current source 90 in the main charge pump CP1. In this example, a phase/frequency detector PFD 92 provides a pump up signal PU and pump down signal PD. When in lock, the current idc of current source 90 is cancelled by having PU pulses wider than the PD pulses; this is accomplished automatically by the feedback action of the PLL.

The error sensor in this embodiment comprises a second charge pump CP2, a capacitor C1, a second capacitor C2, a transconductance means M1, a switch φ1, and a latch.

To perform an error sensing operation, the PLL is locked and switch φ1 is closed. Under these conditions, the transconductance means can be chosen such that is input voltage and output current cause the voltage V1 to settle to a convenient predetermined voltage. This predetermined voltage may have some process and temperature dependent variations. C1 provides a memory for storing the voltage with any such variations included. In this settled mode of operation, M1 draws just enough current to cancel the dc offsets caused by mismatches in the two charge pumps, CP1 and CP2, and the dc phase offset introduced by idc. That is, the current through M1 will balance the average current through I3 and I4 while the loop is in lock.

Figure 7:
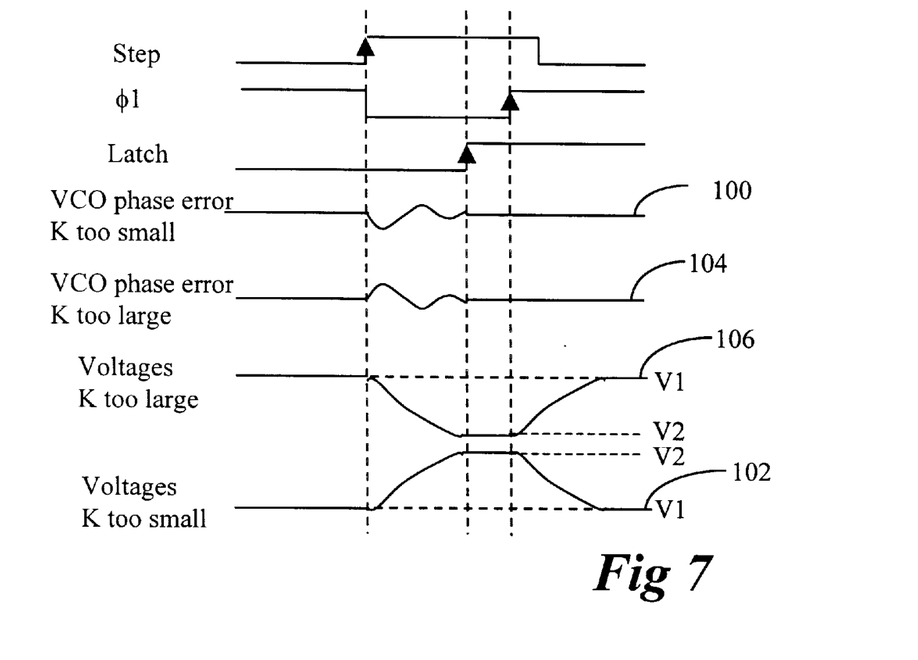
FIG. 7 is a timing diagram and some resulting error signals of the circuit shown in FIG. 6.

To sense the gain error of the DAC, a step is applied to both the Δ-Σ input and the VCO input and φ1 is opened at approximately the same time. The voltage stored on C1 maintains a constant current through M1. As a result, any change in pump current from I3 and I4 caused by phase errors in the PFD output is integrated onto C2. As indicated in FIG. 7, if the DAC gain K is too small, the VCO output phase will initially lag (indicated by 100 in FIG. 7) and this will result in V2 becoming larger than V1 as the PFD increases the average value of I1 (indicated by 102). Similarly, if the DAC gain K is too large, initially the frequency of the VCO will be too fast resulting in a leading phase (indicated by 104) which will cause the PFD to increase the current in I2 and I4; this will result in V2 being less than V1 (indicated by 106). The latch can then compare the two voltages on the latch signal to make a binary decision whether the DAC gain is too large or too small.

There are many variations apparent to those skilled in the art. For example, if idc sources current from a positive supply rather than sinks current to ground, then a PMOS transistor for M1 sourcing current from a positive supply would be more appropriate. Further, if there was no idc or if the mismatch between the two charge pumps could exceed the known dc offset, then a more general transconductance element capable of both sourcing and sinking current may be required. A simple example would be a CMOS inverter.

Figure 8:
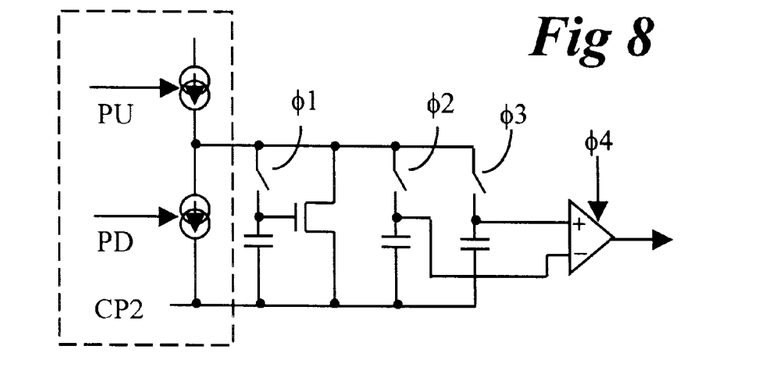
FIG. 8 shows part of a synthesizer having a mechanism for calibrating the scaling factor K or gain of the high frequency path in accordance with yet another embodiment.
Figure 9:
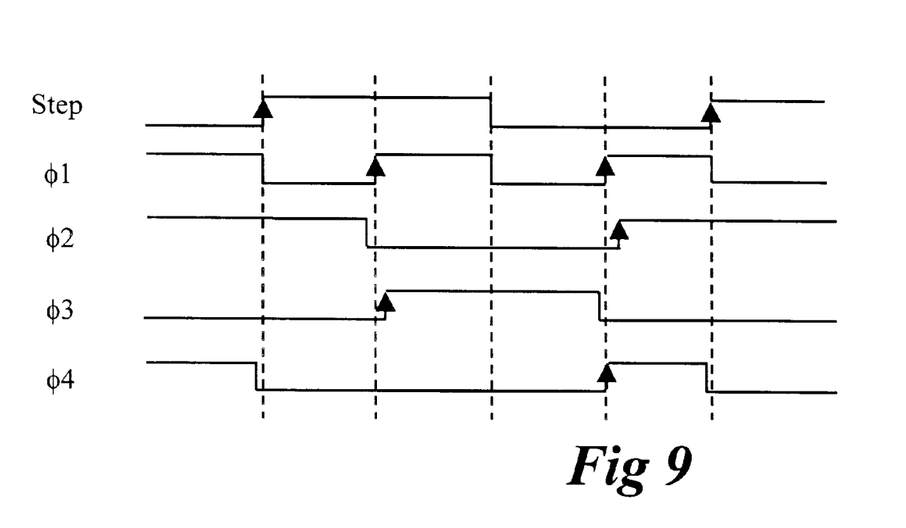
FIG. 9 is a timing diagram of the circuit shown in FIG. 8.

FIG. 8 teaches a yet another embodiment for calibrating the scaling factor K of the high frequency path using both the rising and falling edge of a frequency step. Switch φ1 and its capacitor function as in FIG. 6. For sensing errors, switch φ1 is opened at both the rising and falling edges. Switch φ2 or φ3 is operated to charge the respective capacitor either at the rising or at the falling edge. Switch φ4 latches the comparator for comparison of error signals. FIG. 9 shows the timing diagram.

Figure 10:
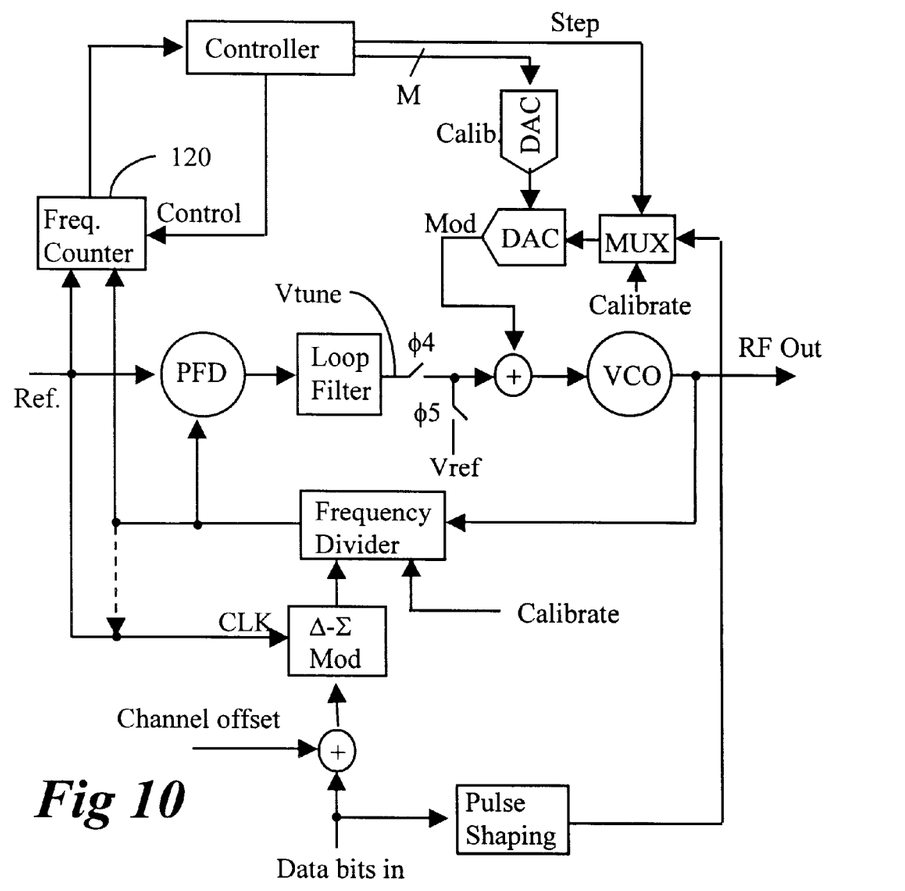
FIG. 10 is a block diagram of the frequency synthesizer according to another embodiment of the invention which is equipped with a different calibration mechanism.

FIG. 10 is illustrates another embodiment of the invention in which the loop is opened during calibration. In this embodiment, therefore, switch φ4 opens the loop and switch φ5 applies a reference voltage (Vref) to the VCO tuning port for calibration. The calibration is performed one bit at a time by applying a step signal to the modulation DAC to set each bit. A frequency counter 120 is used to measure the output frequency of the VCO in relation to the reference frequency. In this embodiment, calibration is performed as follows:

(1) The VCO is disconnected from the loop (switch φ4 opens) and set to a reference voltage (switch φ5 closes).
(2) The divider is set to a fixed integer value.
(3) The frequency of the VCO is measured using the frequency counter and saved.
(4) The MSB of the calibration DAC is set high.
(5) A step signal is applied to the high frequency modulation path through the VCO and left high.
(6) The frequency of the VCO is measured using the frequency counter.
(7) The difference between the frequency measurement before and after the step is compared to a threshold that represents the desired modulation deviation. If the deviation is higher than the threshold the selected calibration bit is set low. If the deviation is lower than the threshold the selected calibration bit is set high.
(8) Steps (3)–(7) are repeated until all calibration bits have been set high or low.

The modulation scheme of the present invention may be also used with an analog modulation signal. In this case, it would be necessary to convert the analog signal into a corresponding digital signal, using a suitable analog-to-digital converter, before applying it to the input of the Δ-Σ modulator. On the other hand, an analog signal might be applied directly, i.e., without conversion, to the summing node, after appropriate scaling. The analog signal might be also shaped prior to the digital conversion, to control the spectral properties of the modulation.

Although various particular embodiments of the present invention have been described herein before, for purposes of illustration, it would be apparent to those skilled in the art that numerous variations may be made thereto without departing from the spirit and scope of the invention, as defined in the appended claims.

What is claimed is:

1. A PLL frequency synthesizer for generating a frequency modulated output signal, comprising:

a phase locked loop circuit for generating an output signal at a predetermined frequency band and having a controlled oscillator, a reference frequency source, a phase/frequency detector, a loop filter and a frequency divider in a feedback path of a loop;

a Δ-Σ modulator having an input for a clock signal from either one of the frequency divider and the reference frequency source, for controlling a division ratio of the frequency divider;

a modulation circuit for applying a digital modulation signal to the input of the Δ-Σ modulator and for adding simultaneously the digital modulation signal to an input of the controlled oscillator, the modulation circuit having a digital-to-analog converter for adding an analog signal corresponding to the digital modulation signal to the input of the controlled oscillator;

a gain adjusting mechanism in a high frequency modulation path for adjusting a level of the modulation signal being added to the input of the controlled oscillator to set a desired frequency deviation at an output of the controlled oscillator in response to a calibration signal; and a calibration circuit for generating the calibration signal in response to outputs of the reference frequency source and the frequency divider.

2. The PLL frequency synthesizer for generating a frequency modulated output signal, according to claim 1, wherein the calibration circuit comprises an error sensor generating an error signal from an output of the phase/frequency detector which compares the outputs of the reference frequency source and the frequency divider.

3. The PLL frequency synthesizer for generating a frequency modulated output signal, according to claim 2 wherein the error sensor further comprises:

an integrating and dump filter connected to the output of the phase/frequency detector, and a sampling mechanism for sampling the charge stored in the integrating and dump filter in response to the error signal in relation to a reference value to generate the calibration signal.

4. The PLL frequency synthesizer for generating a frequency modulated output signal, according to claim 3, wherein the gain adjusting mechanism comprises a calibration digital-to-analog converter, and a digital controller connected to the error sensor, the calibration digital-to-analog converter digitally setting the level of modulation signal by a plurality of bits, and the digital controller applying a step signal so that each of the bits is set progressively one bit at a time.

5. The PLL frequency synthesizer for generating a frequency modulated output signal, according to claim 3, wherein the sampling mechanism comprises a plurality of switches for sampling the charge stored in the integrating and dump filter and reversing the polarity of the reference value.

6. The PLL frequency synthesizer for generating a frequency modulated output signal, according to claim 4, wherein the sampling mechanism comprises a plurality of switches for sampling the charge stored in the integrating and dump filter and reversing the polarity of the reference value.

7. The PLL frequency synthesizer for generating a frequency modulated output signal, according to claim 2, wherein the error sensor comprises:

a charge pump connected at the output of the phase/frequency detector which provides pump-up and pump-down signal;

an integrating and dump filter connected to the output of the phase/frequency detector;

a transconductance element connected to the output of the integrating and dump filter for generating a reference value, and a sampling mechanism for sampling the charge stored in the integrating and dump filter in response to the error signal in relation to the reference value to generate the calibration signal.

8. The PLL frequency synthesizer for generating a frequency modulated output signal, according to claim 7, wherein the gain adjusting mechanism comprises a calibration digital-to-analog converter, and a digital controller connected to the error sensor, the calibration digital-to-analog converter digitally setting the level of modulation signal by a plurality of bits, and the digital controller applying a step signal so that each of the bits is set progressively one bit at a time.

9. The PLL frequency synthesizer for generating a frequency modulated output signal, according to claim 7, further comprising:

an offset current source for providing a dc offset to the charge pump.

10. A PLL frequency synthesizer for generating a frequency modulated output signal, comprising:

a phase locked loop circuit for generating an output signal at a predetermined frequency band and having a controlled oscillator, a reference frequency source, a phase/frequency detector, a loop filter and a frequency divider in a feedback path of a loop;

a digital Δ-Σ modulator having an input for a clock signal from either one of the frequency divider and the reference frequency source, for controlling a division ratio of the frequency divider;

a modulation circuit for applying an analog modulation signal to the input of the Δ-Σ modulator and for adding simultaneously the analog modulation signal to an input of the controlled oscillator, the modulation circuit having a digital-to-analog converter for adding an analog signal corresponding to the analog modulation signal to the input of the controlled oscillator;

an analog-to-digital converter for applying a digital modulation signal corresponding to the analog modulation signal to the input of the Δ-Σ modulator;

a gain adjusting mechanism in a high frequency modulation path for adjusting a level of the modulation signal being added to the input of the controlled oscillator to set a desired frequency deviation at an output of the controlled oscillator in response to a calibration signal; and a calibration circuit for generating the calibration signal in response to outputs of the reference frequency source and the frequency divider.

11. A PLL frequency synthesizer for generating a frequency modulated output signal, comprising:

a phase locked loop circuit for generating an output signal at a predetermined frequency band and having a controlled oscillator, a reference frequency source, a phase/frequency detector, a loop filter and a frequency divider in a feedback path of a loop;

a digital Δ-Σ modulator having an input and for taking in a clock signal from either one of the frequency divider and the reference frequency source, for controlling a division ratio of the frequency divider;

a modulation circuit for applying an analog modulation signal to the input of the Δ-Σ modulator and for adding simultaneously the analog modulation signal to an input of the controlled oscillator;

an analog-to-digital converter for applying a digital modulation signal corresponding to the analog modulation signal to the input of the Δ-Σ modulator;

a gain adjusting mechanism in a high frequency modulation path for adjusting a level of the modulation signal being added to the input of the controlled oscillator to set a desired frequency deviation at an output of the controlled oscillator in response to a calibration signal; and a calibration circuit for generating the calibration signal in response to outputs of the reference frequency source and the frequency divider.

12. The PLL frequency synthesizer for generating a frequency modulated output signal, according to claim 11, wherein the calibration circuit comprises an error sensor generating an error signal from an output of the phase/frequency detector which compares the outputs of the reference frequency source and the frequency divider.

13. The PLL frequency synthesizer for generating a frequency modulated output signal, according to claim 12, wherein the error sensor comprises:

an integrating and dump filter connected to the output of the phase/frequency detector, and a sampling mechanism for sampling the charge stored in the integrating and dump filter in response to the error signal in relation to a reference value to generate the calibration signal.

14. The PLL frequency synthesizer for generating a frequency modulated output signal, according to claim 13, wherein the gain adjusting mechanism comprises a calibration digital-to-analog converter, and a digital controller connected to the error sensor, the calibration digital-to-analog converter digitally setting the level of modulation signal by a plurality of bits, and the digital controller applying a step signal so that each of the bits is set progressively one bit at a time.

15. The PLL frequency synthesizer for generating a frequency modulated output signal, according to claim 13, wherein the sampling mechanism comprises a plurality of switches for sampling the charge stored in the integrating and dump filter and reversing the polarity of the reference value.

16. The PLL frequency synthesizer for generating a frequency modulated output signal, according to claim 14, wherein the sampling mechanism comprises a plurality of switches for sampling the charge stored in the integrating and dump filter and reversing the polarity of the reference value.

17. The PLL frequency synthesizer for generating a frequency modulated output signal, according to claim 12, wherein the error sensor comprises:

a charge pump connected at the output of the phase/frequency detector which provides pump-up and pump-down signal;

an integrating and dump filter connected to the output of the phase/frequency detector;

a transconductance element connected to the output of the integrating and dump filter for generating a reference value, and a sampling mechanism for sampling the charge stored in the integrating and dump filter in response to the error signal in relation to the reference value to generate the calibration signal.

18. The PLL frequency synthesizer for generating a frequency modulated output signal, according to claim 17, wherein the gain adjusting mechanism comprises a calibration digital-to-analog converter, and a digital controller connected to the error sensor, the calibration digital-to-analog converter digitally setting the level of modulation signal by a plurality of bits, and the digital controller applying a step signal so that each of the bits is set progressively one bit at a time.

19. The PLL frequency synthesizer for generating a frequency modulated output signal, according to claim 17, further comprising:

an offset current source for providing a dc offset to the charge pump.

20. The PLL frequency synthesizer for generating a frequency modulated output signal, according to claim 18, further comprising:

an offset current source for providing a dc offset to the charge pump.

21. The PLL frequency synthesizer for generating a frequency modulated output signal, according to claim 1, wherein the gain adjusting mechanism comprises a frequency counter connected to the frequency divider for measuring the frequency of the controlled oscillator, and a switching mechanism for replacing a loop filter output by a reference voltage as the input to the controlled oscillator during calibration.

22. The PLL frequency synthesizer for generating a frequency modulated output signal, according to claim 21, wherein the gain adjusting mechanism comprises a digital controller connected to the frequency counter for generating a digital calibration signal in response to the frequency of the controlled oscillator, and a calibration digital-to-analog converter for setting a level of the digital modulation signal by a plurality of bits, the digital controller applying a step signal so that each of the bits is set progressively one bit at a time.

23. The PLL frequency synthesizer for generating a frequency modulated output signal, according to claim 11, wherein the gain adjusting mechanism comprises a frequency counter connected to the frequency divider for measuring the frequency of the controlled oscillator, and a switching mechanism for replacing a loop filter output by a reference voltage as the input to the controlled oscillator during calibration.

24. The PLL frequency synthesizer for generating a frequency modulated output signal, according to claim 23, wherein the gain adjusting mechanism comprises a digital controller connected to the frequency counter for generating a digital calibration signal in response to the frequency of the controlled oscillator, and a calibration digital-to-analog converter for setting a level of the digital modulation signal by a plurality of bits, the digital controller applying a step signal so that each of the bits is set progressively one bit at a time.

25. A method of generating a frequency modulated output signal, comprising steps of:
    generating an output signal by the phase locked loop circuit which includes a controlled oscillator, a reference frequency source, a phase frequency detector, a loop filter and a frequency divider in a feedback path of a loop;
    providing a modulation signal;
    adding the modulation signal simultaneously to an input of the controlled oscillator and to an input of a Δ-Σ modulator which takes in a clock from either one of the reference frequency source and the frequency divider, for controlling a division ratio of the divider in the feedback path of the loop to modulate the output of the phase locked loop circuit by the modulation signal;
    generating a calibration signal in response to the output of the controlled oscillator relative to the reference frequency; and
    applying the calibration signal to set the level of the modulation signal applied to the input of the controlled oscillator by way of a setting mechanism for calibrating a gain of a high frequency path.

26. The method of generating a frequency modulated output signal, according to claim 25, wherein the step of generating a calibration signal comprises further steps of:
    integrating an error present in the output of the phase/frequency detector;
    sampling the integrated error, and
    comparing the sampled error with a reference value to generate the calibration signal.

27. The method of generating a frequency modulated output signal, according to claim 26, further comprising steps of:
    converting the calibration signal to a digital calibration signal, and
    calibrating the gain of the high frequency path in response to the digital calibration signal, one bit at a time.

28. The method of generating a frequency modulated output signal, according to claim 26, further comprising a step of:
    reversing the polarity of the reference value.

29. The method of generating a frequency modulated output signal, according to claim 27, further comprising a step of:
    reversing the polarity of the reference value.

30. The method of generating a frequency modulated output signal, according to claim 25, wherein the step of generating a calibration signal comprises further steps of:
    replacing the output of the loop filter by a predetermined reference voltage as the input of the controlled oscillator for calibration;
    counting the frequency of the controlled oscillator relative to the reference frequency, and
    setting digital calibration bits in response to the counted frequency of the controlled oscillator while applying a step signal to the high frequency path.

31. The method of generating a frequency modulated output signal, according to claim 30, wherein the step of replacing comprises further steps of:
    disconnecting the output of the loop filter, and
    adding the calibration signal and the reference voltage at the input of the controlled oscillator.

32. The method of generating a frequency modulated output signal, according to claim 31, wherein the step of setting digital calibration bits is performed by one bit at a time at each step signal.

33. The method of generating a frequency modulated output signal, according to claim 25, wherein the step of generating a calibration signal comprises further steps of:
    integrating an error present in the output of the phase/frequency detector;
    generating and storing a reference value using a transconductance element when the phase locked loop circuit is in lock;
    sampling the integrated error, and
    comparing the sampled error with the reference value to generate the calibration signal.

34. The method of generating a frequency modulated output signal, according to claim 33, further comprising steps of:
    converting the calibration signal to a digital calibration signal, and
    calibrating the gain of the high frequency path in response to the digital calibration signal, one bit at a time.

35. The method of generating a frequency modulated output signal, according to claim 33, further comprising a step of:
    introducing a dc offset to a charge pump at the output of the phase/frequency detector.

36. The method of generating a frequency modulated output signal, according to claim 34, further comprising a step of:
    introducing a dc offset to a charge pump at the output of the phase/frequency detector.

37. A method of generating a frequency modulated output signal using a dual port modulation scheme of a phase lock loop circuit, comprising steps of:
    generating an output signal by the phase locked loop circuit which includes a controlled oscillator, a reference frequency source, a phase frequency detector, a loop filter and a frequency divider in a feedback path of a loop;

providing a digital modulation signal;

converting the digital modulation signal to an analog modulation signal;

simultaneously adding the analog modulation signal to an input of the controlled oscillator and the digital modulation signal to an input of a digital Δ-Σ modulator which takes in a clock from either one of the following, the reference frequency source or the frequency divider, for controlling a division ratio of the divider in the feedback path of the loop to modulate the output of the phase locked loop circuit by the modulation signal;

generating a calibration signal in response to the output of the controlled oscillator relative to the reference frequency; and applying the calibration signal to set the level of the modulation signal applied to the input of the controlled oscillator by way of a setting mechanism for calibrating a gain of a high frequency path.

38. The method of generating a frequency modulated output signal, according to claim 37, wherein the step of generating a calibration signal comprises further steps of:

integrating an error present in the output of the phase/frequency detector;

sampling the integrated error, and comparing the sampled error with a reference value to generate the calibration signal.

39. The method of generating a frequency modulated output signal, according to claim 38, further comprising steps of:

converting the calibration signal to a digital calibration signal, and calibrating the gain of the high frequency path in response to the digital calibration signal, one bit at a time.

40. The method of generating a frequency modulated output signal, according to claim 38, further comprising a step of:

reversing the polarity of the reference value.

41. The method of generating a frequency modulated output signal, according to claim 39, further comprising a step of:

reversing the polarity of the reference value.

42. The method of generating a frequency modulated output signal, according to claim 37, wherein the step of generating a calibration signal comprises further steps of:

replacing the output of the loop filter by a predetermined reference voltage as the input of the controlled oscillator for calibration;

counting the frequency of the controlled oscillator relative to the reference frequency, and setting digital calibration bits in response to the counted frequency of the controlled oscillator while applying a step signal to the high frequency path.

43. The method of generating a frequency modulated output signal, according to claim 42, wherein the step of replacing comprises further steps of:

disconnecting the output of the loop filter, and adding the calibration signal and the reference voltage at the input of the controlled oscillator.

44. The method of generating a frequency modulated output signal, according to claim 43, wherein the step of setting digital calibration bits is performed by one bit at a time at each step signal from the most significant bit to the least significant bit.

45. The method of generating a frequency modulated output signal, according to claim 37, wherein the step of generating a calibration signal comprises further steps of:

integrating an error present in the output of the phase/frequency detector;

generating and storing a reference value using a transconductance element when the phase locked loop circuit is in lock;

sampling the integrated error, and comparing the sampled error with the reference value to generate the calibration signal.

46. The method of generating a frequency modulated output signal, according to claim 45, further comprising steps of:

converting the calibration signal to a digital calibration signal, and calibrating the gain of the high frequency path in response to the digital calibration signal, one bit at a time.

47. The method of generating a frequency modulated output signal, according to claim 45, further comprises a step of:

introducing a dc offset to a charge pump at the output of the phase/frequency detector.

48. The method of generating a frequency modulated output signal, according to claim 46, further comprises a step of:

introducing a dc offset to a charge pump at the output of the phase/frequency detector.

49. A method of generating a frequency modulated output signal, comprising steps of:

generating an output signal by the phase locked loop circuit which includes a controlled oscillator, a reference frequency source, a phase frequency detector, a loop filter and a frequency divider in a feedback path of a loop;

providing an analog modulation signal;

converting the analog modulation signal to a digital modulation signal;

simultaneously adding the analog modulation signal to an input of the controlled oscillator and the digital modulation signal to an input of a digital Δ-Σ modulator which takes in a clock from either one of the reference frequency source and the frequency divider, for controlling a division ratio of the divider in the feedback path of the loop to modulate the output of the phase locked loop circuit by the modulation signal;

generating a calibration signal in response to the output of the controlled oscillator relative to the reference frequency; and applying the calibration signal to set the level of the modulation signal applied to the input of the controlled oscillator by way of a setting mechanism for calibrating a gain of a high frequency path.

50. The method of generating a frequency modulated output signal, according to claim 49, wherein the step of generating a calibration signal comprises further steps of:

integrating an error present in the output of the phase/frequency detector, sampling the integrated error, and comparing the sampled error with a reference value to generate the calibration signal.

51. The method of generating a frequency modulated output signal, according to claim 50, further comprising steps of:

converting the calibration signal to a digital calibration signal, and calibrating the gain of the high frequency path in response to the digital calibration signal, one bit at a time.

52. The method of generating a frequency modulated output signal, according to claim 50, further comprising a step of:

reversing the polarity of the reference value.

53. The method of generating a frequency modulated output signal, according to claim 51, further comprising a step of:

reversing the polarity of the reference value.

54. The method of generating a frequency modulated output signal, according to claim 49, wherein the step of generating a calibration signal comprises further steps of:

replacing the output of the loop filter by a predetermined reference voltage as the input of the controlled oscillator for calibration;

counting the frequency of the controlled oscillator relative to the reference frequency, and setting digital calibration bits in response to the counted frequency of the controlled oscillator while applying a step signal to the high frequency path.

55. The method of generating a frequency modulated output signal, according to claim 54, wherein the step of replacing comprises further steps of:

disconnecting the output of the loop filter, and adding the calibration signal and the reference voltage at the input of the controlled oscillator.

56. The method of generating a frequency modulated output signal, according to claim 55, wherein the step of setting digital calibration bits is performed by one bit at a time at each step signal from the most significant bit to the least significant bit.

57. The method of generating a frequency modulated output signal, according to claim 49, wherein the step of generating a calibration signal comprises further steps of:

integrating an error present in the output of the phase/frequency detector;

generating and storing a reference value using a transconductance element when the phase locked loop circuit is in lock;

sampling the integrated error, and comparing the sampled error with the reference value to generate the calibration signal.

58. The method of generating a frequency modulated output signal, according to claim 57, further comprising steps of:

converting the calibration signal to a digital calibration signal, and calibrating the gain of the high frequency path in response to the digital calibration signal, one bit at a time.

59. The method of generating a frequency modulated output signal, according to claim 57, further comprises a step of:

introducing a dc offset to a charge pump at the output of the phase/frequency detector.

60. The method of generating a frequency modulated output signal, according to claim 58, further comprises a step of:

introducing a dc offset to a charge pump at the output of the phase/frequency detector.

* * * * *